United States Patent
Jeong

(10) Patent No.: US 12,438,032 B2
(45) Date of Patent: Oct. 7, 2025

(54) CHUCK PIN ASSEMBLY, AND SUBSTRATE HOLDING APPARATUS AND LIQUID PROCESSING APPARATUS INCLUDING SAME

(71) Applicant: SEMES CO., LTD., Cheonan-si (KR)

(72) Inventor: Cheol Hwan Jeong, Pyeongtaek-si (KR)

(73) Assignee: SEMES CO., LTD., Cheonan-si (KR)

( * ) Notice: Subject to any disclaimer, the term of this patent is extended or adjusted under 35 U.S.C. 154(b) by 411 days.

(21) Appl. No.: 17/554,972

(22) Filed: Dec. 17, 2021

(65) Prior Publication Data
US 2022/0208596 A1 Jun. 30, 2022

(30) Foreign Application Priority Data

Dec. 24, 2020 (KR) .................. 10-2020-0183644

(51) Int. Cl.
*H01L 21/687* (2006.01)
*H01L 21/67* (2006.01)

(52) U.S. Cl.
CPC .. *H01L 21/68728* (2013.01); *H01L 21/67051* (2013.01); *H01L 21/6708* (2013.01); *H01L 21/68707* (2013.01); *H01L 21/68721* (2013.01); *H01L 21/68742* (2013.01)

(58) Field of Classification Search
CPC ......... H01L 21/68728; H01L 21/67051; H01L 21/6708; H01L 21/68721
See application file for complete search history.

(56) References Cited

U.S. PATENT DOCUMENTS

| | | | | |
|---|---|---|---|---|
| 4,788,994 A * | 12/1988 | Shinbara | ............ | B05C 11/08 156/345.55 |
| 6,964,419 B2 * | 11/2005 | Jan | ............ | H01L 21/68728 279/35 |
| 2004/0159343 A1 * | 8/2004 | Shimbara | ............ | H01L 21/68785 134/33 |
| 2005/0223994 A1 * | 10/2005 | Blomiley | ............ | C23C 16/52 118/728 |

(Continued)

FOREIGN PATENT DOCUMENTS

| | | |
|---|---|---|
| JP | 2003088793 A * | 3/2003 |
| JP | 2003-088793 | 3/2004 |

(Continued)

OTHER PUBLICATIONS

"Ball Bearing" from Encyclopedia Britannica, captured on Sep. 6, 2015, available from https://web.archive.org/web/20150906081523/http://www.britannica.com/technology/ball-bearing 2 pages (Year: 2015).*

(Continued)

*Primary Examiner* — Parviz Hassanzadeh
*Assistant Examiner* — Margaret Klunk

(57) ABSTRACT

A chuck pin assembly includes a body member provided on a circumferential portion of a chuck supporting a substrate and configured to be movable with respect to the chuck, a grip member gripping a lateral portion of the substrate, and a rotational connection member rotatably coupling the grip member to the body member. As the grip member is rotatable, it is possible to prevent the chuck pin from being worn at a specific portion which contacts the substrate, and to improve the life of the chuck pin.

6 Claims, 8 Drawing Sheets

OPEN

CLOSE

(56) References Cited

U.S. PATENT DOCUMENTS

| | | | |
|---|---|---|---|
| 2008/0061519 A1* | 3/2008 | Cho | H01L 21/68728 134/159 |
| 2008/0189975 A1* | 8/2008 | Miya | H01L 21/68728 414/781 |
| 2009/0133722 A1* | 5/2009 | Koh | B08B 1/32 134/63 |
| 2010/0024723 A1* | 2/2010 | Hasegawa | H01L 21/68 118/500 |
| 2012/0325275 A1* | 12/2012 | Goodman | H01L 21/68728 269/157 |
| 2013/0214497 A1* | 8/2013 | Yoshida | H01L 21/68728 279/131 |
| 2019/0043740 A1* | 2/2019 | Miyahara | H01L 21/68728 |
| 2019/0333798 A1* | 10/2019 | Tanabe | B65G 47/91 |

FOREIGN PATENT DOCUMENTS

| | | |
|---|---|---|
| JP | 2005-244196 | 9/2005 |
| JP | 2017-143298 | 8/2017 |
| KR | 10-2009-0041154 | 4/2009 |
| KR | 10-2010-0046830 | 5/2010 |

OTHER PUBLICATIONS

Office Action from the Chinese Intellectual Property Office dated Jul. 7, 2024.

\* cited by examiner

OPEN

OPEN

CLOSE

OPEN

CLOSE

CHUCK PIN ASSEMBLY, AND SUBSTRATE HOLDING APPARATUS AND LIQUID PROCESSING APPARATUS INCLUDING SAME

CROSS REFERENCE TO RELATED APPLICATION

The present application claims priority to Korean Patent Application No. 10-2020-0183644, filed Dec. 24, 2020, the entire contents of which is incorporated herein for all purposes by this reference.

BACKGROUND OF THE INVENTION

Field of the Invention

The present disclosure relates to a chuck pin assembly, and a substrate holding apparatus and a liquid processing apparatus including the same.

Description of the Related Art

A semiconductor (or display) manufacturing process is a process for manufacturing a semiconductor device on a substrate (e.g., wafer), and includes, for example, exposure, deposition, etching, ion implantation, cleaning, and the like. In particular, various organic and inorganic foreign substances exist on the substrate. In order to improve the manufacturing yield, it is important to effectively remove foreign substances on the substrate.

A cleaning process using a processing liquid (cleaning liquid) is mainly used to remove foreign substances. The cleaning process may be performed by supplying the processing liquid to an upper or lower surface of the substrate while rotating a spin chuck that supports the substrate. After the cleaning process, a rinsing process using a rinsing liquid and a drying process using a drying gas are performed.

A technique of diffusing a chemical liquid from the center of the substrate to the outer periphery thereof by rotating the substrate while supplying the chemical liquid toward upper and lower portions of the substrate is used in the liquid treatment process. For achieving the technique, support pins supporting the lower portion of the substrate and chuck pins gripping the substrate by being in contact with a lateral surface of the substrate. The chuck pins supporting the lateral surface of the substrate may be worn out as the process is repeatedly performed.

SUMMARY OF THE INVENTION

Accordingly, the present disclosure has been made keeping in mind the above problems occurring in the related art, and the present disclosure is intended to provide a chuck pin assembly, and a substrate holding apparatus and a liquid processing apparatus including the same, which are configured to reduce wear of a chuck pin and to improve the life of the chuck pin.

The problem to be solved is not limited thereto, and other problems not mentioned will be clearly understood by those skilled in the art from the following description.

A chuck pin assembly configured to prevent separation of a substrate, the chuck pin assembly including: a body member provided on a circumferential portion of a chuck configured to support the substrate, and configured to movable with respect to the chuck; a grip member configured to grip a lateral portion of the substrate; and a rotational connection member rotatably coupling the grip member with respect to the body member.

The rotational connection member may be a rotary bearing configured to rotate the grip member with respect to the body member.

The body member may be configured to be rectilinearly moved with respect to a center portion of the chuck.

The grip member may include: a rotary body coupled to the rotational connection member; and a multiple contact portion located on the rotary body and configured to be brought into contact with a plurality of points in the lateral portion of the substrate.

The multiple contact portion may include a first contact pin and a second contact pin configured to be brought into contact with the lateral portion of the substrate.

The body member may be configured to be rotated on a first rotating center shaft thereof with respect to the chuck, the grip member may be configured to be rotated on a second rotating center shaft of the body member.

The rotational connection member may couple the body member to the grip member so that the second rotating center shaft of the grip member may be rotated on a third rotating center shaft.

A substrate holding apparatus may include: a chuck configured to be rotatable; a support pin located on the chuck and configured to hold a lower portion of a substrate; and a chuck pin assembly configured to hold a lateral portion of the substrate and to prevent separation of the substrate, wherein the chuck pin assembly may include: a body member provided on a circumferential portion of the chuck, and configured to movable with respect to the chuck; a grip member configured to grip the lateral portion of the substrate; and a rotational connection member rotatably coupling the grip member with respect to the body member.

A liquid processing apparatus may include: a substrate holding unit configured to hold a substrate; and a processing liquid supply unit configured to supply chemical liquid to the substrate, wherein the substrate holding unit may include: a chuck configured to be rotatable; a support pin located on the chuck and configured to hold a lower portion of the substrate; and a chuck pin assembly configured to hold a lateral portion of the substrate and to prevent separation of the substrate, wherein the chuck pin assembly may include: a body member provided on a circumferential portion of the chuck, and configured to movable with respect to the chuck; a grip member configured to grip the lateral portion of the substrate; and a rotational connection member rotatably coupling the grip member with respect to the body member.

As the grip member is configured to be rotatable, it is possible to prevent the chuck pin from being worn at a specific portion by contact with the substrate, and to improve the life of the chuck pin.

The effect of the present disclosure is not limited to the above description, and other effects not mentioned will be clearly understood by those skilled in the art from the following description.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
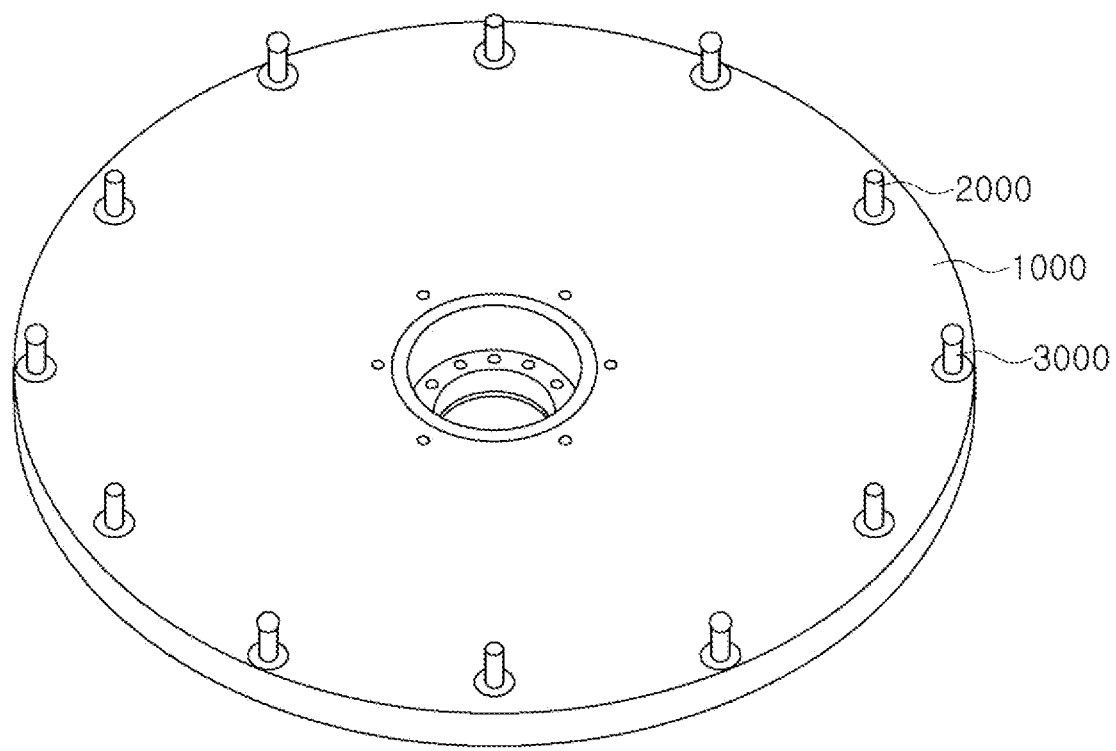
FIG. 1 is a view schematically showing a structure of a chuck provided to support a substrate in a liquid processing apparatus.

Hereinbelow, exemplary embodiments of the present disclosure will be described in detail with reference to the accompanying drawings such that the present disclosure can be easily embodied by one of ordinary skill in the art to which the present disclosure belongs. However, the present disclosure may be changed to various embodiments and the scope and spirit of the present disclosure are not limited to the embodiments described hereinbelow.

In the following description, if it is decided that the detailed description of known function or configuration related to the present disclosure makes the subject matter of the present disclosure unclear, the detailed description is omitted, and the same reference numerals will be used throughout the drawings to refer to the elements or parts with same or similar function or operation.

Furthermore, in various embodiments, an element with same configuration will be described in a representative embodiment by using the same reference numeral, and different configuration from the representative embodiment will be described in other embodiments.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion such as "between" versus "directly between", "adjacent" versus "directly adjacent", etc. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

In the flowing description, unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a view schematically showing a structure of a chuck provided to support a substrate in a liquid processing apparatus. Referring to FIG. 1, a substrate gripping apparatus includes a chuck 1000 as a base, which is provided to secure and rotate a substrate W. Support pins 2000 and chuck pins 3000 are provided on an upper surface of the chuck 1000. Each of the support pins 2000 supports a lower portion of the substrate W. Each of the chuck pins 3000 secures the substrate W by being brought into contact with a lateral surface of the substrate W so as to prevent separation of the substrate W.

As shown in FIG. 1, the support pins 2000 are arranged at an outer circumferential portion of the chuck 1000 at constant intervals. The chuck pins 3000 may be arranged at the outer circumferential portion of the chuck 1000 at constant intervals. Normally, the support pins 2000 and the chuck pins 3000 are fixed on the chuck 1000. The chuck pins 3000 may be located outside the outer circumferential portion of the chuck 1000 where the support pins 2000 are provided.

The chuck pins 3000 may be rectilinearly moved in a horizontal direction on a center portion of the chuck 1000. Without the substrate W, the chuck pins 3000 are located outside the lateral surface of the substrate W. When the substrate W is placed, the chuck pins 3000 are located at contact locations closer to the center portion of the substrate W so as to be brought into contact with the lateral surface of the substrate W.

For example, when the substrate W to be liquid-processed is loaded on upper portions of the support pins 2000, the chuck pins 3000 are rectilinearly moved from non-contact locations to the contact locations and are brought into contact with the lateral surface of the substrate W. The chuck pins 3000 grip the substrate W, so that the substrate W on which liquid processing is performed is not separated from its location. When the process for the substrate W is complete, the chuck pins 3000 are rectilinearly moved from the contact locations to the non-contact locations, so that the contact between the chuck pins and the substrate W is released. Meanwhile, the chuck pins 3000 may be brought into contact with the substrate W by rotary movement in addition to the rectilinear movement.

In the liquid treatment process (e.g.: cleaning process and coating process) for the substrate W, since the substrate W is rotated, the chuck pins 3000 may be worn out due to the contact between the substrate W and the chuck pins 3000. When it is difficult to properly grip the substrate W due to the wear of the chuck pins 3000 as the process is repeatedly performed, an operator should replace the chuck pins 3000.

Figure 2:
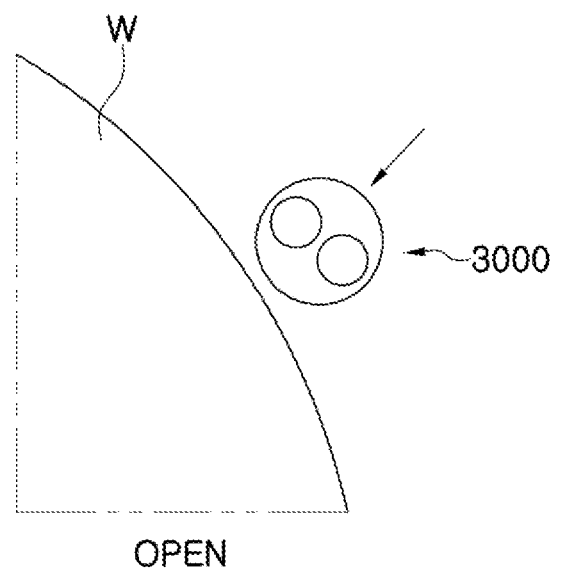
FIG. 2 is a view showing an example in which eccentricity occurs in a rectilinearly movable chuck pin.
Figure 2:
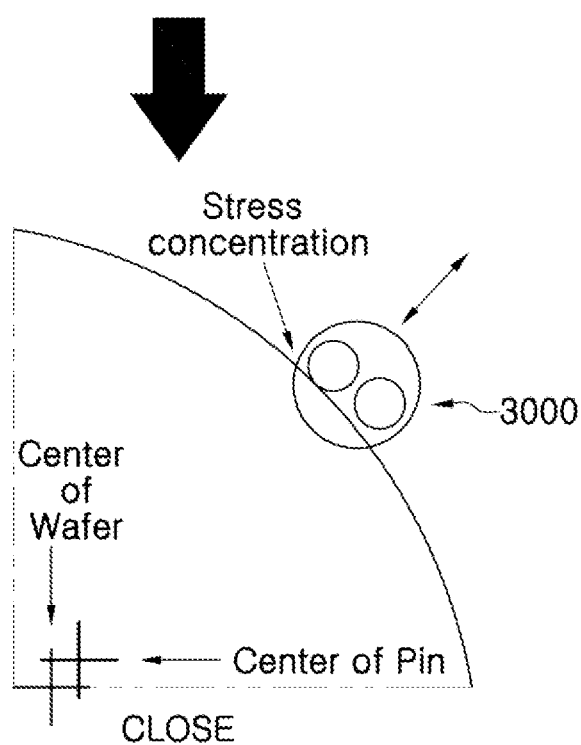

FIG. 2 is a view showing an example in which eccentricity occurs in a rectilinearly movable chuck pin. Referring to FIG. 2, when the substrate W is loaded, the chuck pins 3000 are rectilinearly moved from the non-contact locations to the contact locations so as to be brought into contact with the substrate W.

In order to improve the life of the chuck pins 3000, the substrate W is necessarily brought into contact with not only a specific portion of the chuck pin 3000, but also other portions thereof. However, as shown in FIG. 2, when the rectilinearly movable chuck pin 3000 is fixed and the rotary center of the substrate W and the rotary center of the chuck pin 3000 including two contact portions coincide with each other, stress is concentrated on a specific portion of the chuck pin 3000. When stress is concentrated on the specific portion of the chuck pin 3000 wear is generated only on the specific portion and the entire chuck pin 3000 should be replaced even by a little wear.

Therefore, in the embodiment of the present disclosure, a contact portion of the chuck pin 3000 between the chuck pin 3000 and the substrate W is rotatable, so that the rotary center of the chuck pin 3000 and the rotary center of the substrate W may coincide with each other.

Figure 3:
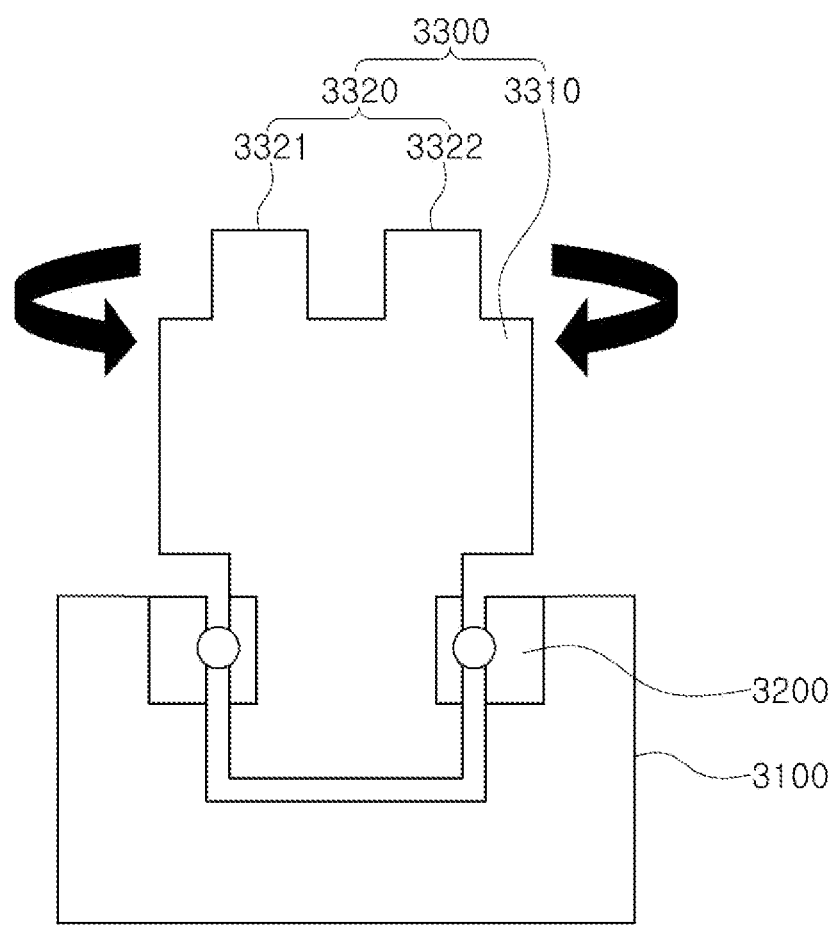
FIG. 3 is a view showing a schematic structure of a chuck pin assembly according to an embodiment of the present disclosure.

FIG. 3 is a view showing a schematic structure of a chuck pin assembly according to an embodiment of the present disclosure. In the specification, the chuck pin assembly is an assembly of the chuck pins 3000 and parts related thereto for prevention separation of the substrate W. The chuck pin assembly may be used as the same term as the chuck pins 3000.

The chuck pin assembly according to the present disclosure includes a body member 3100 provided on a circumferential portion of the chuck 1000 supporting the substrate W and configured to be rectilinearly moved with respect to the chuck 1000, a grip member 3300 gripping the lateral portion of the substrate W, and a rotational connection member 3200 rotatably coupling the grip member 3300 to the body member 3100. According to the embodiment of the present disclosure, the grip member 3300 gripping the lateral portion of the substrate W is rotatable, so that the rotary center of the substrate W and the rotary center of the grip member 3300 may coincide with each other. Therefore, as shown in FIG. 2, it is possible to prevent the grip member from being worn, at a specific portion, by contact with the substrate.

According to the embodiment of the present disclosure, the rotational connection member 3200 may be provided as a rotary bearing that rotates the grip member 3300 with respect to the body member 3100. For example, the rotational connection member 3200 may be configured such that an inner ring and an outer ring are respectively provided at the body member 3100 and the grip member 3300. A boll or a roller that allows the rotational connection member 3200 to be efficiently rotated may be arranged between the inner ring and the outer ring of the rotational connection member 3200.

Figure 4:
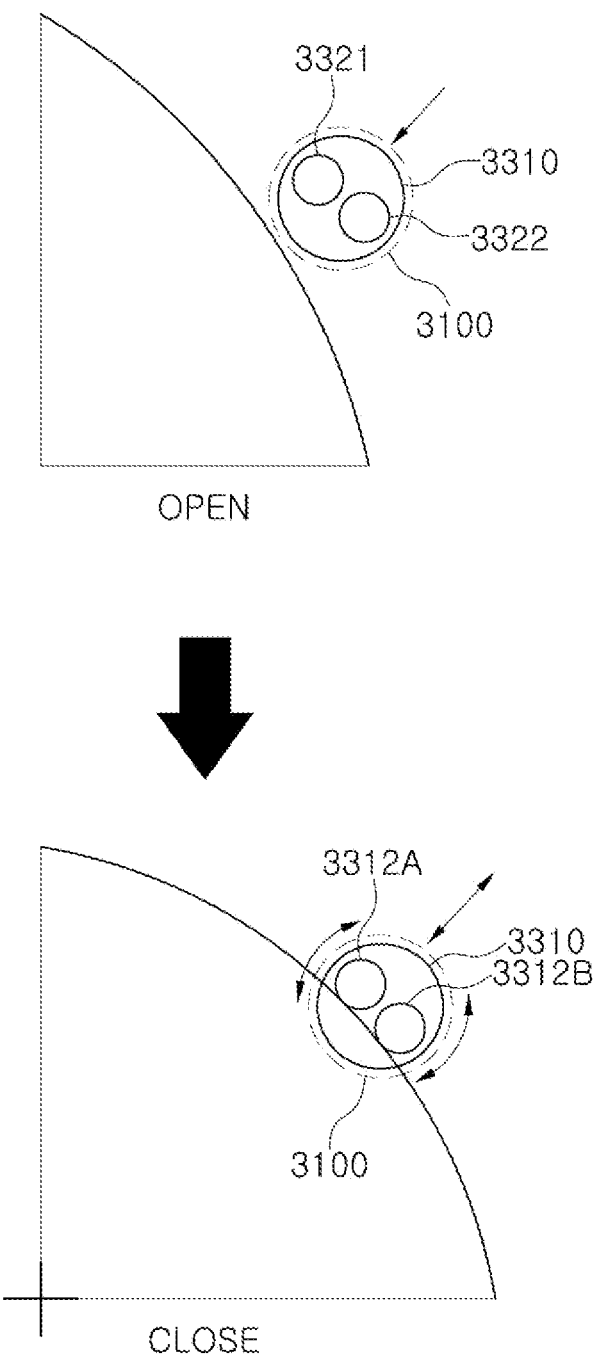
FIG. 4 is a view showing an example in which a rectilinearly movable chuck pin assembly holding the substrate.

According to the embodiment of the present disclosure, the body member 3100 may be rectilinearly moved with respect to the center portion of the chuck 1000. For example, the body member 3100 may reciprocate in a straight line for a certain distance from the center portion of the chuck 1000. As shown in FIGS. 2 and 4, when the substrate W is loaded, the body member 3100 may be moved from an open location (non-contact location) to a close location (contact location). When the substrate W is removed, the body member 3100 may be moved from the close location (contact location) to the open location (non-contact location).

As shown in FIG. 3, the grip member 3300 according to the embodiment of the present disclosure includes a rotary body 3310 coupled to the rotational connection member 3200, and a multiple contact portion 3320 located on the rotary body 3310 and brought into contact with a plurality of points at the lateral portion of the substrate W. The multiple contact portion 3320 may include a first contact pin 3321 and a second contact pin 3322 that are brought into contact with the lateral portion of the substrate W.

FIG. 4 is a view showing an example in which a rectilinearly movable chuck pin assembly holding the substrate. As described above, as the grip member 3300 brought in contact with the substrate W is configured to be rotatable, the rotary center of the substrate W and the rotary center of the grip member 3300 may coincide. As shown in FIG. 4, as both the first contact pin 3321 and the second contact pin 3322 of the grip member 3300 are in contact with the substrate W, stress may be distributed.

Figure 5:
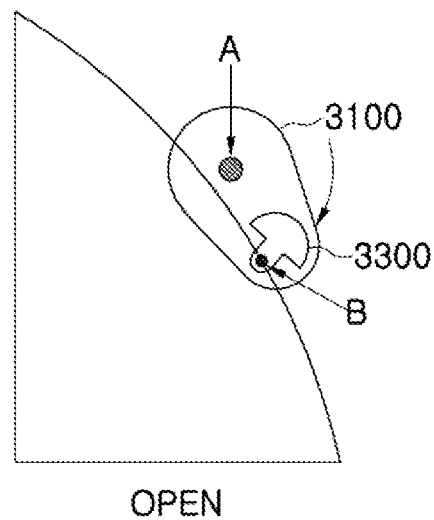
FIG. 5 is a view showing an example in which eccentricity occurs in a rotatably movable chuck pin.
Figure 5:
Figure 5:
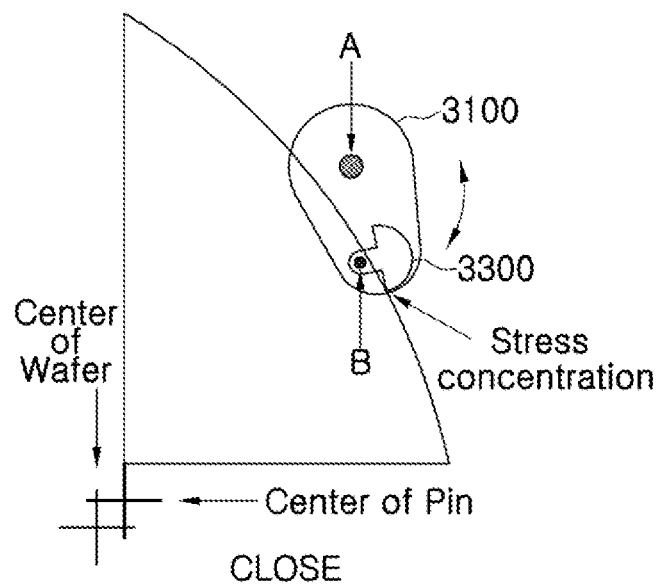

FIG. 5 is a view showing an example in which eccentricity occurs in a rotatably movable chuck pin. The body member 3100 may be rotatably moved with respect to the chuck 1000.

Referring to FIG. 5, the grip member 3300 is provided on the body member 3100, the body member 3100 is rotated on a first rotating center shaft A. The grip member 3300 is rotated on a second rotating center shaft B fixed in the body member 3100, thus is brought into contact with the substrate W. For example, as shown in FIG. 5, when the substrate W is loaded, the chuck pin 3000 may be rotatably moved from the open location (non-contact location) to the close location (contact location) by a rotation driving member. When the substrate W is removed, the chuck pin 3000 may be rotatably moved from the close location (contact location) to the open location (non-contact location).

As shown in FIG. 5, when the rotary center of the second rotating center shaft B of the grip member 3300 in the body member 3100 and the rotary center of the substrate W do not coincide with each other, stress is concentrated on a specific portion of the grip member 3300 so that wear may be generated in the specific portion thereof. Therefore, the chuck pin assembly according to the embodiment of the present disclosure may be configured such that the second rotating center shaft B is rotatable so that the rotary center of the second rotating center shaft B of the grip member 3300 by the body member 3100 and the rotary center of the substrate W coincide with each other.

According to the embodiment of the present disclosure, the body member 3100 is configured to rotate via a first rotating center shaft A of the body member 3100, and the rotational connection member 3200 is configured to rotate via a second rotating center shaft B of the body member 3100 and the rotational connection member 3200. The grip member 3300 is configured to rotate via a third rotating center shaft C of the rotational connection member 3200 and the grip member 3300.

Figure 6:
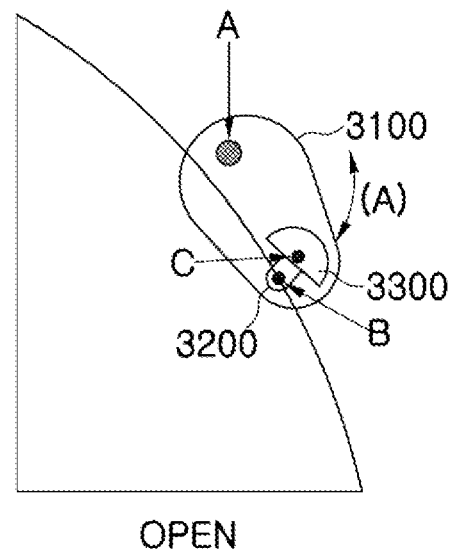
FIG. 6 is a view showing an example in which a rotatably movable chuck pin assembly holding the substrate.
Figure 6:
Figure 6:
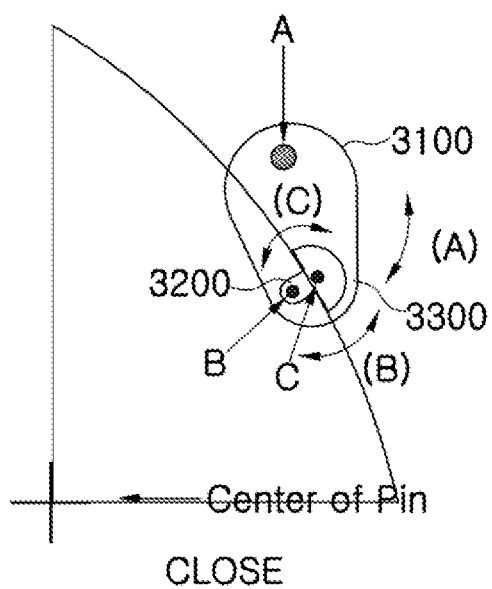

More specifically, as shown in FIG. 6, the grip member 3300 may be rotated on the third rotating center shaft C with respect to the rotational connection member 3200. As shown in FIG. 6, the rotary center of the grip member 3300 in the body member 3100 may coincide with the substrate W. Therefore, stress may not be concentrated on a specific portion of the grip member 3300 as shown in FIG. 5, but a linear contact portion of the grip member 3300 is brought into contact with the substrate W at least two locations as shown in FIG. 6.

According to the embodiment of the present disclosure, the chuck pin assembly may be provided as a part of the substrate holding apparatus shown in FIG. 1. The substrate holding apparatus according to the embodiment of the present disclosure includes the chuck 1000 configured to be rotatable, the support pin 2000 located on the chuck 1000 and supporting the lower portion of the substrate W, and the chuck pins 3000 supporting the lateral portion of the substrate W to prevent separation of the substrate W. The chuck pin assembly includes the body member 3100 provided on the circumferential portion of the chuck 1000 and configured to be rectilinearly moved with respect to the chuck 1000, the grip member 3300 gripping the lateral portion of the substrate W, and the rotational connection member 3200 rotatably coupling the grip member 3300 to the body member 3100.

According to the embodiment of the present disclosure, the rotational connection member 3200 may be provided as a rotary bearing that rotates the grip member 3300 with respect to the body member 3100.

According to the embodiment of the present disclosure, the body member 3100 may be rectilinearly moved with respect to the center portion of the chuck.

The grip member 3300 according to the embodiment of the present disclosure includes the rotary body 3310 coupled to the rotational connection member 3200, and the multiple contact portion 3320 located on the rotary body 3310 and brought into contact with a plurality of points at the lateral portion of the substrate W.

According to the embodiment of the present disclosure, the multiple contact portion 3320 may include the first contact pin 3321 and the second contact pin 3322 that are brought into contact with the lateral portion of the substrate W.

According to the embodiment of the present disclosure, the body member 3100 is configured to be rotatably moved on the first rotating center shaft A with respect to the chuck 1000. The grip member 3300 may be configured to be rotated on the second rotating center shaft B of the body member 3100.

According to the embodiment of the present disclosure, the rotational connection member 3200 may couple the body member 3100 to the grip member 3300 so that the second rotating center shaft B of the grip member 3300 is rotated on the third rotating center shaft C.

Figure 7:
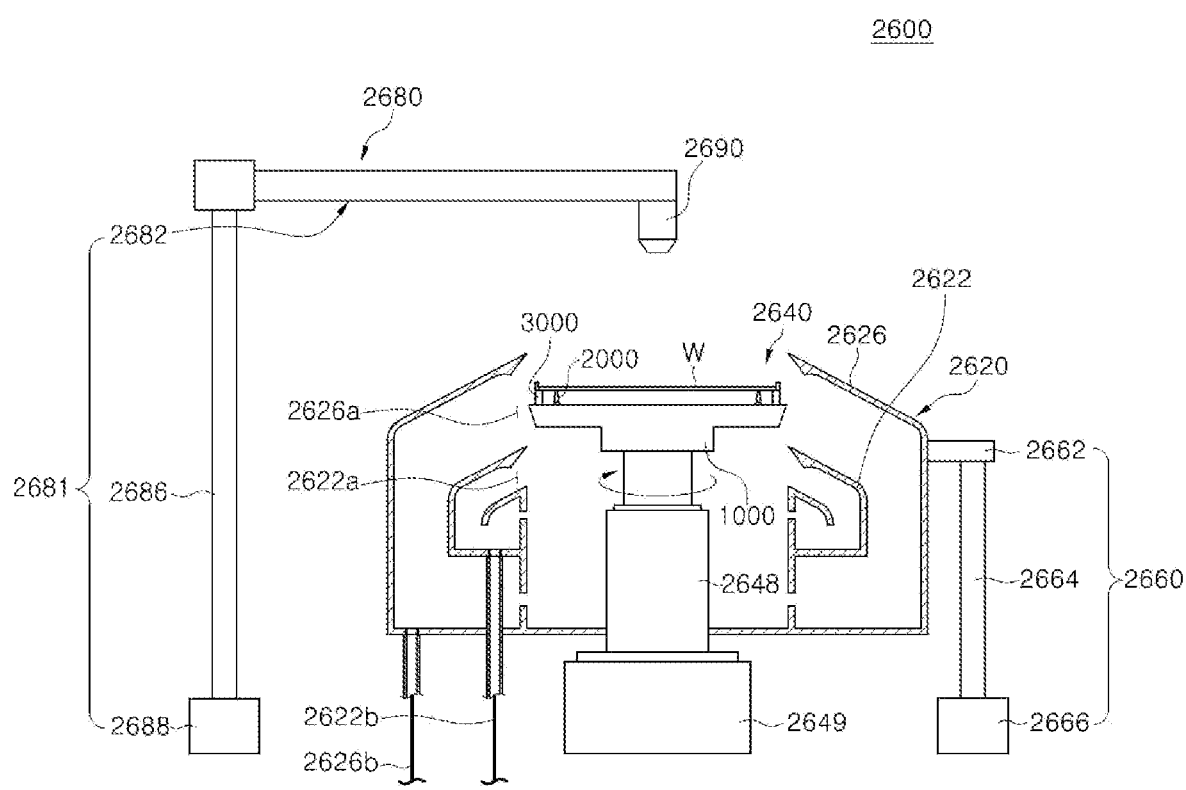
FIG. 7 is a view showing an example showing a liquid processing apparatus to which the chuck pin assembly according to the embodiment of the present disclosure is applied.

FIG. 7 is a view showing an example showing a liquid processing apparatus to which the chuck pin assembly according to the embodiment of the present disclosure is applied.

Referring to FIG. 7, a liquid processing apparatus 2600 provided in a liquid treatment chamber includes a processing container 2620, a substrate holding unit 2640, a raising and lowering unit 2660, and a processing liquid supply unit 2680. The liquid processing apparatus 2600 provided in the liquid treatment chamber may supply the processing liquid to the substrate W. For example, the processing liquid may be an etchant, a cleaning solution, a rinse solution, and an organic solvent. Etchant or cleaning solution may be a liquid with basic properties and may include sulfuric acid (H2SO4), phosphoric acid (P2O5), hydrofluoric acid (HF), and ammonium hydroxide (NH4OH). The processing liquid may be diluted sulfuric acid peroxide (DSP).

The rinse solution may be de-ionized water (H2O). The organic solvent may be isopropyl alcohol (IPA), i.e., a low surface tension fluid.

The processing container 2620 may provide a processing space in which the substrate is processed. The processing container 2620 may have a barrel shape with an open upper portion. The processing container 2620 may include the outer recovery container 2626 (or first recovery container) and an inner recovery container 2622 (or second recovery container). The recovery containers 2622 and 2626 respectively recover different processing liquids among the processing liquids used in processes. The inner recovery container 2622 is formed in a ring shape surrounding the substrate holding unit 2640. The outer recovery container 2626 may be formed in a ring shape surrounding the inner recovery container 2622. An inside space 2622*a* of the inner recovery container 2622 serves as an inner inlet 2622*a* through which the processing liquid flows into the inner recovery container 2622. An interspace 2626*a* located between the inner recovery container 2622 and the outer recovery container 2626 serves as an outer inlet 2626*a* through which the processing liquid flows into the outer recovery container 2626. Each of the inlets 2622*a* and 2626*a* may be located at different height from each other. Recovery lines 2622*b* and 2626*b* are respectively connected to lower surfaces of the recovery containers 2622 and 2626. The processing liquid introduced into each of the recovery containers 2622 and 2626 may be reused by being provided into an external processing liquid recycling system (not shown) through the recovery lines 2622*b* and 2626*b*.

The substrate holding unit 2640 holds the substrate W in the processing space. The substrate holding unit 2640 may hold and rotate the substrate W during the process. The substrate holding unit 2640 includes the chuck 1000, the support pins 2000, the chuck pins 3000, and a rotation driving member. The chuck 1000 is formed in a generally circular plate shape.

The support pins 2000 may include a plurality of support pins 2000. The plurality of support pins 2000 is projected from the chuck 1000 and supports the lower surface of the substrate W.

The chuck pins 3000 may include a plurality of chuck pins 3000. The plurality of chuck pins 300 is projected from the chuck 1000 and supports lateral portions of the substrate W. The chuck pins 3000 support the lateral portions of the substrate W so as to prevent the substrate W from deviating radially from an original location when the chuck 1000 is rotated. The chuck pins 3000 are provided to be rectilinearly movable between outer locations and inner locations thereof in a radial direction of the chuck 1000. When the substrate W is loaded or unloaded on the chuck 1000, the chuck pins 3000 are located at the outer locations. When the process for the substrate W is performed, the chuck pins 3000 are located at the inner locations. The inner locations (contact locations) are locations where the chuck pins 3000 and the lateral portions of the substrate W are brought into contact with each other. The outer locations (non-contact locations) are locations where the chuck pins 3000 and the substrate W are separated from each other.

The rotation driving member 2648, 2649 rotates the chuck 1000. The chuck 1000 is rotatable on a central shaft thereof by the rotation driving member 2648, 2649. The rotation driving member 2648, 2649 includes a support shaft 2648 and a driving part 2649. The support shaft 2648 may have a barrel shape formed in a third direction 16. An upper end of the support shaft 2648 may be securely coupled to a lower surface of the chuck 1000. The driving part 2649 provides a driving force so that the support shaft 2648 is rotated. The support shaft 2648 is rotated by the driving part 2649, and the chuck 1000 may be rotated together with the support shaft 2648.

The raising and lowering unit 2660 vertically moves the processing container 2620 in a vertical direction. As the processing container 2620 is vertically moved, a relative height of the processing container 2620 to the chuck 1000 is changed. When the substrate W is loaded or unloaded on the chuck 1000, the raising and lowering unit 2660 is operated such that the processing container 2620 is lowered so as to project the chuck 100 upward from the upper portion of the processing container 2620. Furthermore, during the process, depending on a type of the processing liquid supplied to the substrate W, the height of the processing container 2620 is adjusted, so that the processing liquid flows into the preset recovery container 2622, 2626. The raising and lowering unit 2660 includes a bracket 2662, a moving shaft 2664, and a driving unit 2666. The bracket 2662 is securely provided on an outer wall of the processing container 2620. The moving shaft 2664 may be securely coupled to the bracket 2662 and vertically moved by the driving unit 2666. The raising and lowering unit 2660 may selectively move the chuck 1000 in the vertical direction.

The processing liquid supply unit 2680 supplies the processing liquid to the substrate W. The processing liquid supply unit 2680 may include a plurality of processing liquid supply units 2680. The processing liquid supply units 2680 may supply respectively different types of processing liquids.

The processing liquid supply unit 2680 may include a moving member 2681 and a nozzle 2690.

The moving member 2681 may move the nozzle 2690 to a process location and a waiting location. The process location may be a location where the nozzle 2690 faces an upper surface of the substrate W held on the substrate holding unit 2640. The waiting location may be a location where the nozzle 2690 is out of the process location.

The moving member 2681 may include a support shaft 2686, an arm 2674, and a driving device 2688. The support shaft 2686 is located at one side of the processing container 2620. The support shaft 2686 may have a rod shape extending in the third direction 16. The support shaft 2686 is provided to be rotatable by the driving device 2688. The support shaft 2686 may be provided to be movable in the vertical direction. The arm 2674 is coupled to an upper end of the support shaft 2686 and may perpendicularly extend from the support shaft 2686. The nozzle 2690 is securely coupled to an end of the arm 2674. As the support shaft 2686 is rotated, the nozzle 2690 may be swung with the arm 2674. The nozzle 2690 is swung to be moved to the process location and the waiting location. The arm 2674 may be provided to be selectively movable forward and rearward in a longitudinal direction thereof. In a view from the top, a route in which the nozzle 2690 is moved may coincide with a central shaft of the substrate W at the process location.

The chuck pin assembly according to the embodiment of the present disclosure may be provided as a part of a substrate holding unit 2640 in the liquid processing apparatus shown in FIG. 7. The liquid processing apparatus according to the embodiment of the present disclosure includes the substrate holding unit 2640 holding the substrate W, and the processing liquid supply unit 2680 supplying the chemical liquid to the substrate W. The substrate holding unit 2640 includes the chuck 1000 configured to be rotatable, the support pin 2000 located on the chuck 1000 and supporting the lower portion of the substrate W, and the chuck pins 3000 supporting the lateral portion of the substrate W to prevent separation of the substrate W. The chuck pin assembly includes the body member 3100 provided on the circumferential portion of the chuck 1000 and configured to be rectilinearly moved with respect to the chuck 1000, the grip member 3300 gripping the lateral portion of the substrate W, and the rotational connection member 3200 rotatably coupling the grip member 3300 to the body member 3100.

Figure 8:
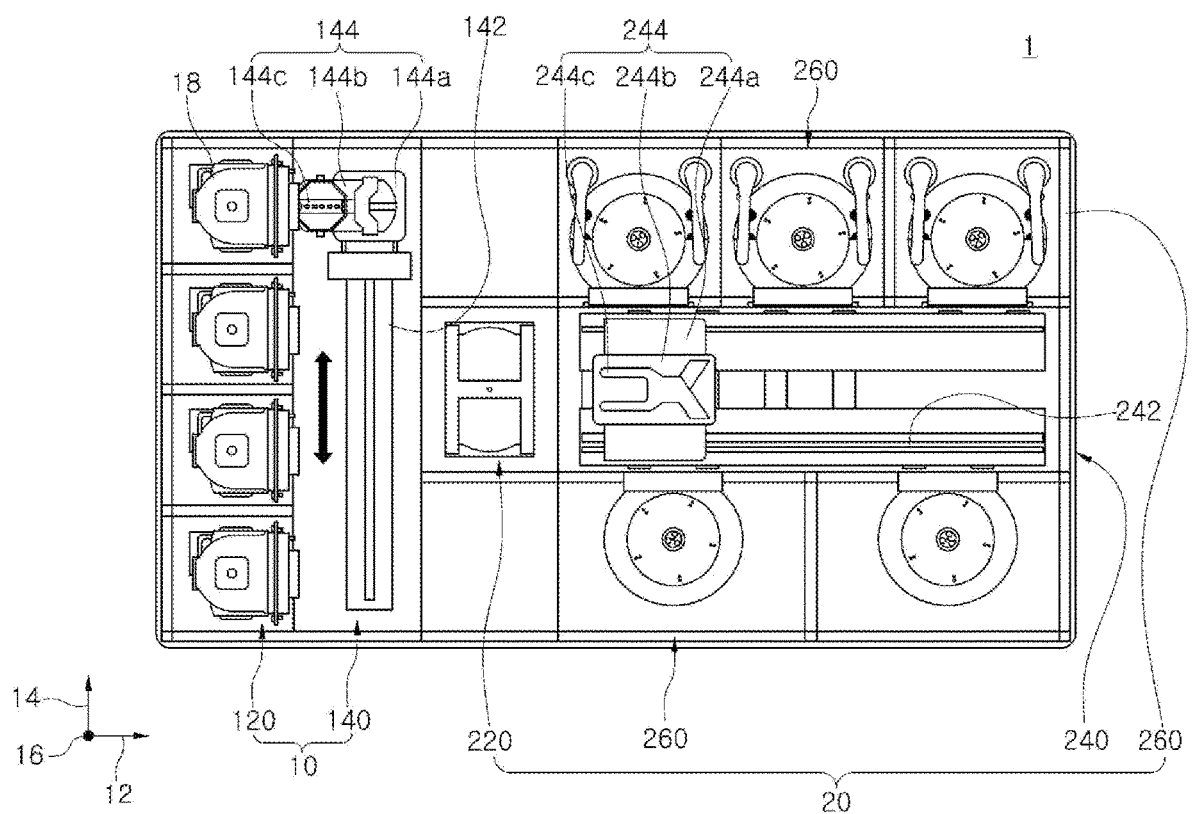
FIG. 8 is a view showing a structure substrate processing equipment to which the chuck pin assembly according to the embodiment of the present disclosure is applied.

FIG. 8 is a view showing a structure substrate processing equipment to which the chuck pin assembly according to the embodiment of the present disclosure is applied.

Referring to FIG. 8, the substrate processing equipment 1 includes an index module 10 and a processing module 20. The index module 10 includes a load port 120 and a transfer frame 140. The load port 120, the transfer frame 140, and the processing module 20 are sequentially arranged in a line. Hereinbelow, a direction in which the load port 120, the transfer frame 140, and the processing module 20 are arranged is referred to a first direction 12. In a view from the top, a direction perpendicular to the first direction 12 is referred to a second direction 14. A direction perpendicular to a plane including the first direction 12 and the second direction 14 is referred to a third direction 16.

A carrier 18 storing the substrate W may be seated on the load port 120. The load port 120 may include a plurality of load ports 120, and the plurality of load ports 120 may be arranged in a line along the second direction 14. FIG. 1 is a view in which four load ports 120 are provided. However, the number of the load ports 120 may increase or decrease in response to conditions such as process efficiency of the processing module 20 and footprint. The carrier 18 has a slot (not shown) provided to support a rim of the substrate. The slot may include a plurality of a plurality of slots arranged along the third direction 16. The substrate is located in the carrier to be layered while being spaced apart from another substrate in the third direction 16.

A front opening unified pod (FOUP) may be used as the carrier 18.

The processing module 20 includes the buffer unit 220, a transfer chamber 240, a process chamber 260, and an exhaust assembly. The transfer chamber 240 is configured such that a longitudinal direction thereof is arranged in parallel to the first direction 12. Process chambers 260 are arranged on opposite sides of the transfer chamber 240 in the second direction 14. The process chambers 260 may be provided to be arranged symmetrically on the basis of the transfer chamber 240. Each of the process chambers 260 may include the substrate processing apparatus as shown in FIG. 8. Some of the process chambers 260 may be arranged in the longitudinal direction of the transfer chamber 240. Some of the process chambers 260 may be arranged to be layered with each other. On the opposite sides of the transfer chamber 240, the process chambers 260 are arranged in an arrangement of A×B (each of A and B is a natural number equal to or greater than 1). A is the number of the process chambers 260 provided in a line along the first direction 12. B is the number of the process chambers 260 provided in a line along the third direction 16. When four or six process chambers 260 are provided on each of the opposite sides of the transfer chamber 240, the process chambers 260 may have an arrangement of 2×2 or 3×2. The number of the process chambers 260 may increase or decrease.

Alternately, the process chambers 260 may be provided only on one side of the transfer chamber 240. The process chambers 260 may be provided on a first side or a second side of the transfer chamber 240 as a single layer. The process chamber 260 may be variously arranged as not described above. Some of the process chambers 260 provided on the first side of the transfer chamber 240 perform the liquid treatment process for the substrate. Some of the process chambers 260 provided on the second side of the transfer chamber 240 perform the drying process for the substrate that has been processed under the liquid treatment process. The drying process may be a supercritical process.

The buffer unit 220 is arranged between the transfer frame 140 and the transfer chamber 240. The buffer unit 220 provides a space in which the substrate W waits before being carried between the transfer chamber 240 and the transfer frame 140. The buffer unit 220 has slots (not shown) in which the substrate W is placed, and the plurality of slots (not shown) are provided to be spaced apart from each other in the third direction 16. The buffer unit 220 has a surface that faces the transfer frame 140 and is open and a surface that faces the transfer chamber 240 and is open.

The transfer frame 140 transfers the substrate W between the carrier 18 seated on each of the load ports 120 and the buffer unit 220. The transfer frame 140 has an index rail 142 and an index robot 144. The index rail 142 is provided such that a longitudinal direction thereof is parallel to the second direction 14. The index robot 144 is provided on the index rail 142, and is rectilinearly moved in the second direction 14 along the index rail 142. The index robot 144 includes a base 144a, a body 144b, and an index arm 144c. The base 144a is movably provided along the index rail 142. The body 144b is coupled to the base 144a. The body 144b is movably provided in the third direction 16 on the base 144a. The body 144b is rotatably provided on the base 144a. The index arm 144c is coupled to the body 144b, and is provided to be movable forward and rearward with respect to the body 144b. A plurality of index arms 144c may be provided and independently driven. The index arms 144c are arranged to be layered with each other while being spaced apart from each other in the third direction 16. Some of the index arms 144c may be used to transfer the substrate W from a processing module 20 to the carrier 18, and some of the index arms 144c may be used to transfer the substrate W from the carrier 18 to the processing module 20. Therefore, in a process of inserting and removing the substrate W by the index robot 144, particles generated on a substrate W before the process may be prevented from being attached to a substrate W after the process.

The transfer chamber 240 transfers the substrate W between the buffer unit 220 and the process chambers 260. The transfer chamber 240 includes a guide rail 242 and a main robot 244. The guide rail 242 may be arranged such that a longitudinal direction thereof is parallel to the first direction 12. The main robot 244 is provided on the guide rail 242 and rectilinearly moves in the first direction 12 on the guide rail 242.

The liquid processing apparatus according to the embodiment of the present disclosure may be realized as a part of the process chamber 260 described above.

Although the preferred embodiments of the present disclosure have been disclosed for illustrative purposes, those skilled in the art will appreciate that various modifications, additions and substitutions are possible, without departing from the scope and spirit of the invention as disclosed in the accompanying claims. Since the present disclosure may be embodied in other specific forms without changing the technical sprit or essential features, those skilled in the art to which the present disclosure belongs should understand that the embodiments described above are exemplary and not intended to limit the present disclosure.

The scope of the present disclosure will be defined by the accompanying claims rather than by the detailed description, and those skilled in the art should understand that various modifications, additions and substitutions derived from the meaning and scope of the present disclosure and the equivalent concept thereof are included in the scope of the present disclosure.

What is claimed is:

1. A chuck pin assembly for securing a substrate, the chuck pin assembly comprising:
   a body member provided at a circumferential portion of a chuck and configured to be movable with respect to the chuck, wherein the chuck is configured to support the substrate;
   a grip member configured to grip a lateral surface of the substrate; and
   a rotational connection member configured to rotatably couple the grip member to the body member,
   wherein the rotational connection member is configured to rotate via a second rotating center shaft of the body member,
   wherein the grip member is configured to rotate via a third rotating center shaft of the rotational connection member,
   wherein the grip member, when viewed in a plan view, includes at least two linear contact portions which are configured to contact at least two locations of the lateral surface of the substrate at the same time, respectively,
   wherein the at least two linear contact portions are and positioned on opposite sides of the third rotating center shaft in a circumferential direction around an edge of the chuck when securing the substrate,
   wherein the body member is configured to rotate via a first rotating center shaft of the body member, and
   wherein the grip member vertically overlaps the body member.

2. The chuck pin assembly of claim 1,
   wherein the rotational connection member is a rotary bearing that rotatably contacts the body member.

3. A substrate holding apparatus comprises:
   a chuck configured to rotate;
   a support pin located on the chuck and configured to hold a lower surface of a substrate; and
   a chuck pin assembly configured to contact a lateral surface of the substrate and to secure the substrate on the chuck that is rotating,
   wherein the chuck pin assembly comprises:
   a body member provided at a circumferential portion of the chuck, and configured to be movable with respect to the chuck;
   a grip member configured to grip the lateral surface of the substrate; and
   a rotational connection member configured to rotatably couple the grip member to the body member,
   wherein the rotational connection member is configured to rotate via a second rotating center shaft of the body member,
   wherein the grip member is configured to rotate via a third rotating center shaft of the rotational connection member,
   wherein the grip member, when viewed in a plan view, includes at least two linear contact portions which are configured to contact at least two locations of the lateral surface of the substrate at the same time, respectively,
   wherein the at least two linear contact portions are and positioned on opposite sides of the third rotating center shaft in a circumferential direction around an edge of the chuck when securing the substrate,
   wherein the body member is configured to rotate via a first rotating center shaft of the body member, and
   wherein the grip member vertically overlaps the body member.

4. The substrate holding apparatus of claim 3,
   wherein the rotational connection member is a rotary bearing that rotatably contacts the body member.

5. A liquid processing apparatus comprises:
   a substrate holding unit configured to hold a substrate; and
   a processing liquid supply unit configured to supply chemical liquid to the substrate,
   wherein the substrate holding unit comprises:
   a chuck configured to rotate;
   a support pin located on the chuck and configured to hold a lower surface of the substrate; and
   a chuck pin assembly configured to contact a lateral surface of the substrate and to secure the substrate on the chuck that is rotating,
   wherein the chuck pin assembly comprises:

a body member provided at a circumferential portion of the chuck, and configured to be movable with respect to the chuck;

a grip member configured to grip the lateral surface of the substrate; and a rotational connection member configured to rotatably couple the grip member to the body member, wherein the rotational connection member is configured to rotate via a second rotating center shaft of the body member, wherein the grip member is configured to rotate via a third rotating center shaft of the rotational connection member, wherein the grip member, when viewed in a plan view, includes at least two linear contact portions which are configured to contact at least two locations of the lateral surface of the substrate at the same time, respectively, wherein the at least two linear contact portions are and positioned on opposite sides of the third rotating center shaft in a circumferential direction around an edge of the chuck when securing the substrate when securing the substrate, wherein the body member is configured to rotate via a first rotating center shaft of the body member, and wherein the grip member vertically overlaps the body member.

6. The liquid processing apparatus of claim 5, wherein the rotational connection member is a rotary bearing that rotatably contacts the body member.

* * * * *